United States Patent [19]

Nelson et al.

[11] Patent Number: 4,884,630
[45] Date of Patent: Dec. 5, 1989

[54] END FED LIQUID HEAT EXCHANGER FOR AN ELECTRONIC COMPONENT

[75] Inventors: Richard D. Nelson, Austin, Tex.; Omkarnath R. Gupta, Englewood, Colo.

[73] Assignee: Microelectronics and Computer Technology Corporation, Austin, Tex.

[21] Appl. No.: 220,758

[22] Filed: Jul. 14, 1988

[51] Int. Cl.$^4$ .............................. F28F 3/14
[52] U.S. Cl. ..................... 165/170; 165/80.4; 361/385
[58] Field of Search ............ 165/80.4, 170, 185, 165/146; 361/384, 385; 357/82

[56] References Cited

U.S. PATENT DOCUMENTS

| | | | |
|---|---|---|---|
| 1,443,189 | 1/1923 | Malm | 165/170 |
| 2,613,065 | 10/1952 | Didier | 165/146 |
| 3,817,321 | 6/1974 | von Cube et al. | 165/105 |
| 4,072,188 | 2/1978 | Wilson et al. | 165/80 |
| 4,079,410 | 3/1978 | Schierz | 357/82 |
| 4,298,059 | 11/1981 | Krauth et al. | 165/166 |
| 4,558,395 | 12/1985 | Yamada et al. | 361/385 |
| 4,573,067 | 2/1986 | Tuckerman et al. | 357/82 |
| 4,628,991 | 12/1986 | Hsiao et al. | 165/80.4 |
| 4,631,636 | 12/1986 | Andrews | 361/385 |
| 4,686,606 | 8/1987 | Yamada et al. | 361/385 |

FOREIGN PATENT DOCUMENTS

| | | | |
|---|---|---|---|
| 8540009 | 8/1985 | European Pat. Off. | |
| 683041 | 7/1979 | U.S.S.R. | 361/385 |

Primary Examiner—Martin P. Schwadron
Assistant Examiner—Allen J. Flanigan
Attorney, Agent, or Firm—Fulbright & Jaworski

[57] ABSTRACT

A body having a bottom and first and second ends and a cavity therein. A plurality of substantially parallel spaced fins are positioned in the cavity. A liquid inlet is centrally positioned in the first end of the body and a liquid outlet is centrally positioned in the second end of the body where flowing cooling liquid between the fins from the first end to the second end with higher fluid flow between the fins in the center for preferentially cooling the center of the heat exchanger. A cross-sectional area of the liquid path in the body minimizes pressure drops and avoids abrupt direction changes and cross-sectional changes. The width, height and spacing of the fins may be varied to control the temperature of the areas in the bottom.

9 Claims, 2 Drawing Sheets

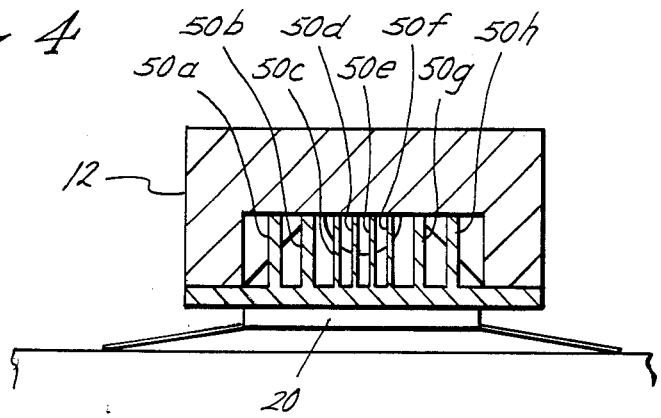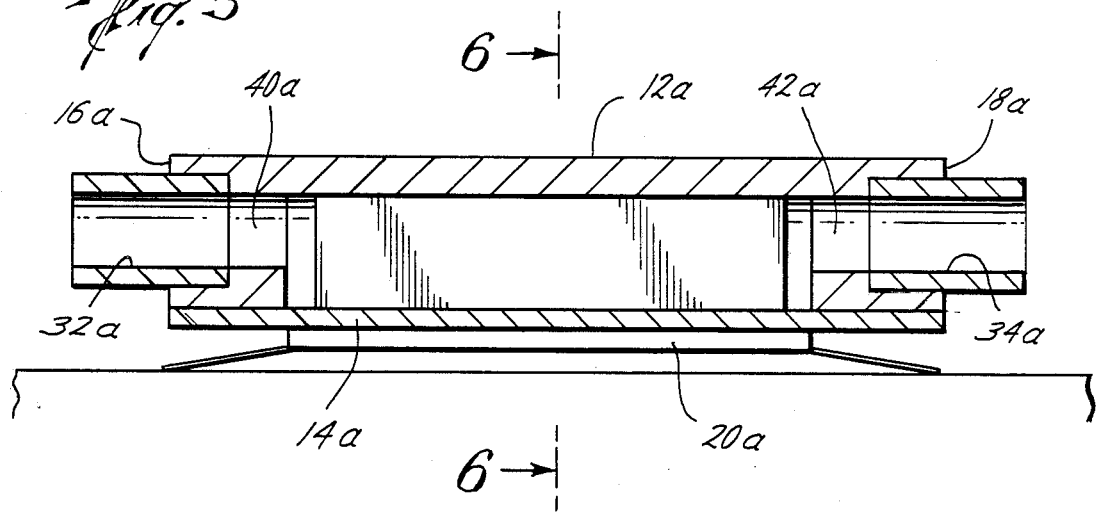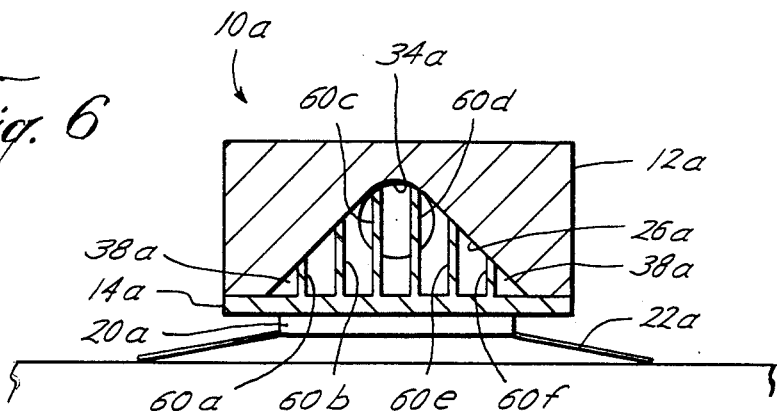

END FED LIQUID HEAT EXCHANGER FOR AN ELECTRONIC COMPONENT

BACKGROUND OF THE INVENTION

It is known to use a liquid cooled heat exchanger for cooling electronic components such as electronic chips. The present invention is directed to an improved liquid cooled heat exchanger with high performance in a heat exchanger having a plurality of substantially parallel spaced cooling fins. The present invention provides high efficiency cooling by using a liquid inlet and outlet in line with the liquid channels between the fins and preferentially cools the center of the heat exchanger while at the same time minimizes the pressure drop of the cooling liquid flowing through the heat exchanger.

SUMMARY

The present invention is directed to an end fed liquid heat exchanger for an electron component which includes a body having a bottom, and first and second ends, and said body has a cavity therein. A plurality of substantially parallel spaced fins are positioned in the cavity and connected to the bottom. The fins have first and second ends positioned adjacent the first and second body ends, respectively. A liquid inlet is centrally positioned in the first end of the body and a liquid outlet is centrally positioned in the second end of the body for flowing cooling liquid between the fins from their first ends to their second ends thereby providing higher liquid flow between the fins in the center of the bottom. This increased liquid velocity in the center results in a higher heat transfer coefficient to the cooling fins in the center and provides preferential cooling to the center of the heat exchanger which typically has the hottest temperature.

Another feature of the present invention is wherein the liquid cross-sectional area in the body from the inlet to the outlet except for the area between fins is substantially the same for minimizing pressure losses.

Still a further object of the present invention is the provision of a curved and tapered transitional section between the inlet and the cavity and also between the outlet and the cavity for avoiding abrupt liquid direction changes and abrupt liquid cross-sectional area changes. The transitional sections also encourage increased liquid flow through the center of the heat exchanger.

Yet a still further object of the present invention is wherein the first and second ends of the fins are slanted downwardly and outwardly towards the bottom ends for minimizing pressure losses at the ends of the fins and also providing the maximum heat exchange area in the center of the bottom.

Still a further object of the present invention is the adjustment of the fin width, height and/or spacing between the fins to control the temperature of the areas in the bottom of the heat exchanger. That is, the surface area of the fins in the center of the cavity may be greater than the surface area of the fins at the edges of the cavity for increasing the heat transfer in the center. The additional surface area at the center may be provided by providing more fins at the center with smaller spacings between the fins at the center or providing smaller width fins thereby increasing the number and surface area of the fins or increasing the height of the fins in the center. Decreasing the spacing between the fins also increases the heat transfer coefficient.

Still a further object of the present invention is wherein the cross-sectional shape of the cavity may be triangular.

Other and further objects, features and advantages will be apparent from the foregoing description of presently preferred embodiments of the invention, given for the purpose of disclosure and taken in conjunction with the accompanying drawings.

BRIEF DESCRIPTION OF THE DRAWINGS

FIG. 4 is a view similar to FIG. 3 but with a different configuration in the sizes of the fins, FIG. 5 is an elevational view, in cross section, of another embodiment of the present invention, and FIG. 6 is a cross-sectional view taken along the line 6—6 of FIG. 5.

DESCRIPTION OF THE PREFERRED EMBODIMENTS

Figure 1:
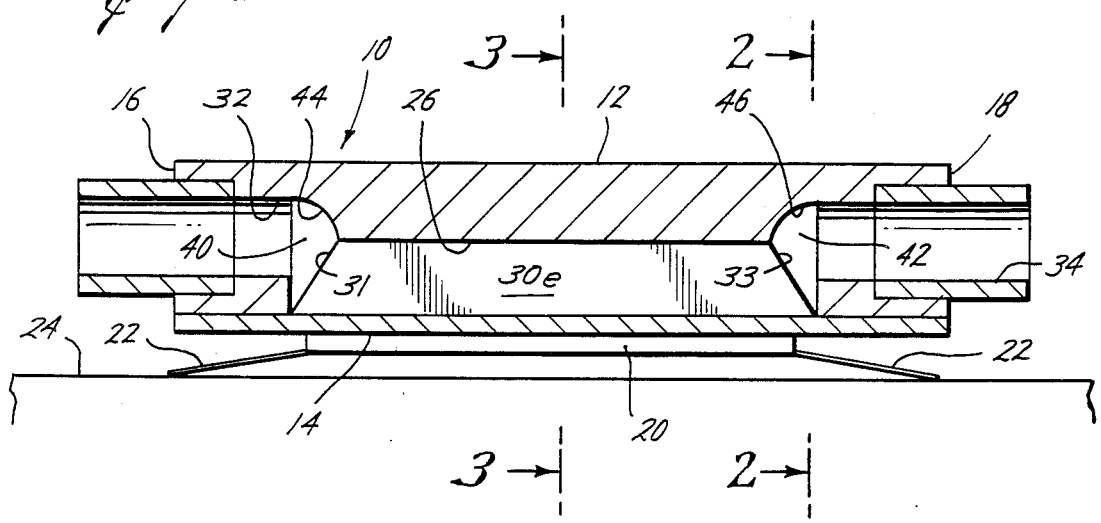
FIG. 1 is an elevational view, in cross section, of one form of the heat exchanger of the present invention.
Figure 2:
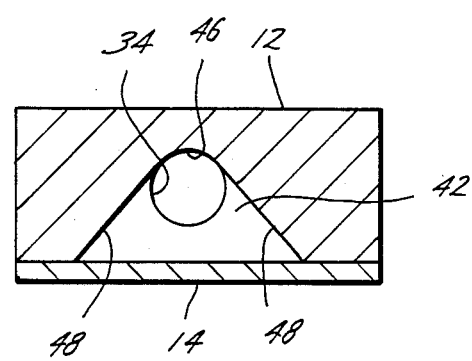
FIG. 2 is a cross-sectional view taken along the line 2—2 of FIG. 1.
Figure 3:
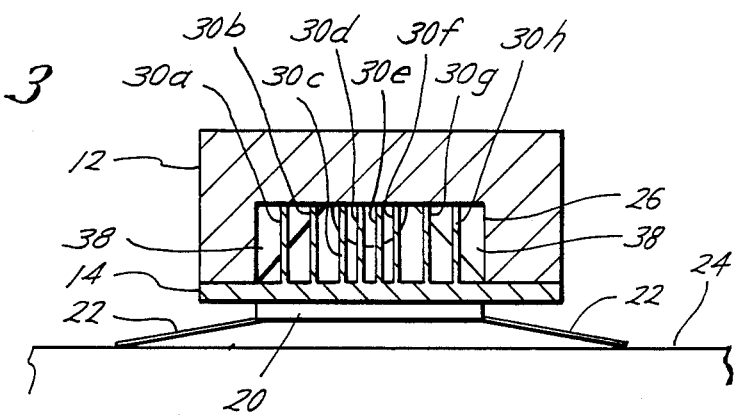
FIG. 3 is a cross-sectional view taken along the line 3—3 of FIG. 1.

Referring to the drawings, and particularly to FIGS. 1–3, the reference numeral 10 generally indicates the end fed liquid heat exchanger of the present invention having a body 12 with a bottom 14, a first end 16, and a second end 18. The bottom 14 is shown positioned mated against an electronic component such as a chip 20 which in turn is connected by suitable electrical connections 22 to a substrate 24. The function of the heat exchanger 12 is to provide cooling to the chip 20.

The body 12 includes a cavity 26 and a plurality of substantially parallel spaced fins 30a, 30b, 30c, 30d, 30e, 30f, 30g and 30h connected to the bottom 14. The number of fins shown is for convenience only and any suitable number may be used.

The thickness and spacing between the fins may vary. By way of example, the thickness may be 0.0010 or 0.0020 inches and the spacing between the fins may also be any suitable amount such as 0.0010 or 0.0020 inches.

A liquid inlet 32 is centrally positioned in the first end 16 of the body 12 and a liquid outlet 34 is centrally positioned in the second end 18 of the body 12 for flowing cooling liquid, for example water, between the fins. The fins include first ends 31 and second ends 33 with the first ends 31 positioned adjacent the first end 16 of the body 12 and the second ends 33 being positioned adjacent the second end 18 of the body 12. Therefore, fluid from the inlet 32 flows to the outlet 34 from the first ends 31 of the fins to the second ends 33 of the fins through the spaces or channels therebetween.

This structure provides preferential cooling to the center of the heat exchange 10 which typically has the hottest temperature, even when the chip 20 has a nominally uniform distribution of heat sources and nominally uniform cooling. The present invention not only provides a high degree of cooling, but it provides extra cooling of the areas which would otherwise have higher temperatures. That is, normally, the highest fluid velocity in the tubular inlet 32 and the tubular outlet 34 is in the axial center of the inlet 32 and outlet 34. Therefore, more liquid flows around the center fins 30c, 30d, 30e and 30f than the outer fins 30a, 30b, 30g and 30h.

The increased liquid velocity in the center results in a higher heat transfer coefficient to the fins in the center and provides preferential cooling to the center of the heat exchanger 10. This results in increased cooling to the center of the chips 20 which usually run hotter in uniformly cooled designs. This preferential cooling also decreases the temperature difference between points on the surface of the chips 20.

Additionally, the heat exchanger is provided with a curved and tapered transitional section 40 between the inlet 32 and the cavity 26 and a curved and tapered transitional section 42 between the outlet 34 and the cavity 26 for keeping velocity changes to a minimum to minimize pressure losses. In addition, the transitional sections 40 and 42 encourage liquid flow to be moved to the center of the cavity 26 rather an at the edges 38, thereby aiding the desired preferential cooling of the center.

The transitional sections 40 and 42 avoid abrupt liquid direction changes and abrupt liquid cross-sectional changes. That is, a curved section 44 provides a curved entry between the inlet 32 and the cavity 26 and the curved section 46 provides a curved exit between the cavity 26 and the outlet 34 and each of the sections 40 and 42 include tapered sides 48 which mate with the fin section, as best seen in FIG. 2, to encourage liquid flow to be more in the center of the heat exchanger than at the edges 38. Also the liquid cross-sectional area in the body from the inlet 32 to the outlet 34, except for the cavity 26, is substantially the same for minimizing velocity changes to minimize pressure losses. That is, the cross-sectional area of the inlet 32, the transitional area 40, the transitional area 42, and the outlet area 34 are substantially the same. However, the cross-sectional area of the space between the fins in the cavity 26 is preferably about one-half the area of the other sections for increasing the heat transfer coefficient.

It is to be noted that the ends 31 and 33 of the fins preferably have slanted or chamfered ends which slant downwardly and outwardly towards the bottom ends. This feature provides a lower pressure drop operation by minimizing pressure losses at the entrance and exit of the fins. In addition, the slant edges 31 and 33 provide for a relatively lower temperature difference on the chip surface 20 by providing more fin area in the central region where it is needed than at the first ends 31 and second ends 33 where less fin area is required. The slant ends 31 and 33 may also be selected to control the cross-sectional area of the transitional sections 40 and 42.

While all of the fins may be of equal thickness and spaced apart with equal spacing, the cooling in the center can be enhanced further by increasing the surface area of the fins in the center, relative to the fins at the edges, by varying the width of the fins and/or the channel spacing between the fins. Cooling can be increased by providing one or more additional fins in the center with smaller spacing, for example, five fins with 0.010 inches spacing versus four fins with 0.020 inch spacing. This will increase the surface area by 25% and will increase the local heat transfer coefficient by approximately 80%. This will result in an increased overall heat transfer rate of 2.25.

Referring to FIG. 3, it is noted that all of the fins, 30a–30h, are of equal thick fins 30c, 30d, 30e and 30f have been spaced closer together and therefore increase the total surface area of fins in the center of the body 12 as compared with the fins 30a, 30b, 30g and 30h at the edges of the body 12 as well as increasing the heat transfer coefficient in the center thereby increasing the local heat transfer at the center, particularly in view of the greater liquid velocity flow in the center.

In FIG. 4, another embodiment of fins is shown in which center fins 50c, 50d, 50e and 50f are not only thinner than the fins 50a, 50b, 50g and 50h at the edges but are also spaced closer together thereby further increasing the surface area of the fins in the center and further increasing the local heat transfer coefficient.

Other and further embodiments may be provided such as shown in FIGS. 5 and 6 wherein like parts to those shown in FIGS. 1–3 are similarly numbered with the addition of the suffix "a". It is to be noted that the cavity 26a containing the fins 60a, 60b, 60c, 60d, 60e, 60f is triangularly shaped in cross section whereby the liquid flow through the center of the cavity 26a is not only at an increased velocity, but its volume is considerably greater than the volume of the liquid flowing near the edges 38a. This feature further increases the cooling efficiency in the center of the heat exchanger 10a by providing fins nearer the center with greater heights and therefore with greater surface area. As shown in FIG. 6, the fins 60a–60f are equal in thickness and spacing, but again this can be varied to control the temperature of the areas of the bottom 14a as desired.

Using the design of the present invention, it has been calculated that the present invention will provide cooling to 100 watt chips of one square centimeter in size, and yet maintain the temperature within 85° C. Further, the present invention is calculated to maintain the temperature difference on the chip to within 15° to 20° C. The present invention provides lower thermal resistance by providing higher heat transfer by higher liquid velocities at preferential center locations and by providing more fin area at the center such as by providing a greater number of fins and/or smaller spacing of the fins with various widths and heights, by providing a liquid flow profile to encourage preferential flow to the center, all of which provides a lower temperature difference on the chip. The present invention also provides lower pressure drops through the heat exchanger by keeping the velocity changes to a minimum along the path of the liquid flow, by curving the fluid flow walls which cause any direction changes for liquid flow, and by using a regenerative technique to reduce the overall pressure drop.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will readily suggest themselves to those skilled in the art and which are encompassed within the spirit of the invention and the scope of the appended claims.

What is claimed is:

1. An end fed liquid heat exchanger for an electronic component comprising, a body having a bottom and first and second ends, said body having a cavity therein, a plurality of substantially parallel spaced fins positioned in the cavity and connected to the bottom, said fins having first and second ends positioned adjacent the first and second body ends, respectively, a liquid inlet centrally positioned in the first end of the body with respect to the plurality of spaced fins, and a liquid outlet centrally positioned in the second end of the body with respect to the plurality of spaced fins for flowing cooling liquid between the fins from the first ends to the second ends of the fins with higher flow between the fins in the center, and said body includes a transitional section between the inlet and the cavity and between the outlet and the cavity and the liquid cross-sectional area in the body from the inlet to the outlet, except for the area in the cavity, is substantially the same for minimizing pressure losses.

2. The apparatus of claim 1 wherein the cross-sectional area in the cavity is approximately one-half of the other cross sections in the body.

3. The apparatus of claim 1 wherein, the surface area fins in the center of the cavity is greater than the surface area of fins at the edges for increasing the heat transfer.

4. The apparatus of claim 3 wherein the additional surface area at the center is provided by providing more fins at the center with a smaller spacing between said fins.

5. The apparatus of claim 1 wherein the fins in the center of the cavity are spaced closed together than the fins at the edges of the cavity thereby providing a greater heat transfer coefficient at the center of the cavity.

6. An end fed liquid heat exchanger for an electronic component comprising,
- a body having a bottom and first and second ends, said body having a cavity therein,
- a plurality of substantially parallel spaced fins positioned in the cavity and connected to the bottom, said fins having first and second ends positioned adjacent the first and second body ends, respectively,
- a liquid inlet centrally positioned in the first end of the body, and a liquid outlet centrally positioned in the second end of the body for flowing cooling liquid between the fins from the first ends to the second ends of the fins with higher flow between the fins in the center, and
- a curved and tapered transitional section between the inlet and cavity and between the outlet and the cavity for avoiding abrupt liquid direction changes and abrupt liquid cross-sectional changes.

7. An end fed liquid heat exchanger for an electronic component comprising,
- a body having a bottom and a first and second ends, said body having a cavity therein,
- a plurality of substantially parallel spaced fins positioned in the cavity and connected to the bottom, said fins having first and second ends positioned adjacent the first and second body ends, respectively,
- a liquid inlet centrally positioned in the first end of the body, and a liquid outlet centrally positioned in the second end of the body for flowing cooling liquid between the fins from the first ends to the second ends of the fins with higher flow between the fins in the center, said first and second ends of the fins are slanted downwardly and outwardly toward the bottom of the ends for providing a lower pressure drop.

8. An end liquid heat exchanger for an electronic component comprising,
- a body having a bottom and a first and second ends, said body having a cavity therein,
- a plurality of substantially parallel spaced fins positioned in the cavity and connected to the bottom, said fins having first and second ends positioned adjacent the first and second body ends, respectively,
- a liquid inlet centrally positioned in the first end of the body, and a liquid outlet centrally positioned in the second end of the body for flowing cooling liquid between the fins from the first ends to the second ends of the fins with higher flow between the fins in the center, said cross-sectional shape of the cavity is triangular.

9. An end fed liquid heat exchange for an electronic component comprising, a body having a bottom and first and second ends, said body having a cavity therein,
- a plurality of substantially parallel spaced fins positioned in the cavity and connected to the bottom for cooling an electronic component positioned against the bottom, said fins having first and second ends positioned adjacent the first and second body ends, respectively,
- a liquid inlet centrally positioned in the first end of the body, and a liquid outlet centrally positioned in the second end of the body for flowing cooling liquid between the fins from the first ends to the second ends of the fins with higher flow between the fins in the center,
- said body including a curved and tapered transitional section between the inlet and the cavity and between the outlet and the cavity for avoiding abrupt liquid direction changes and abrupt liquid cross-sectional area changes, and
- said liquid cross-sectional area in the body from the inlet to the outlet is substantially the same for minimizing pressure losses except for the cross-sectional area in the cavity which is approximately one-half of the other areas.

* * * * *

UNITED STATES PATENT AND TRADEMARK OFFICE
CERTIFICATE OF CORRECTION

PATENT NO. : 4,884,630

DATED : December 5, 1989

INVENTOR(S) : Richard D. Nelson, et al

It is certified that error appears in the above-identified patent and that said Letters Patent is hereby corrected as shown below:

Col. 3, line 64, after "thick" insert --ness but that the center--

Col. 5, line 23, delete "closed" and insert --closer--

Col. 6, line 28, delete "exchange" and insert --exchanger--

Signed and Sealed this

Seventeenth Day of November, 1992

*Attest:*

DOUGLAS B. COMER

*Attesting Officer*   *Acting Commissioner of Patents and Trademarks*